United States Patent
Fivas et al.

(10) Patent No.: US 7,669,313 B2
(45) Date of Patent: Mar. 2, 2010

(54) METHOD FOR FABRICATING A THIN FILM RESISTOR SEMICONDUCTOR STRUCTURE

(75) Inventors: Joseph D. Fivas, Midvale, UT (US); Georgina Shah, Tucson, AZ (US); Dianna L. Chandler, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 653 days.

(21) Appl. No.: 11/178,673

(22) Filed: Jul. 11, 2005

(65) Prior Publication Data

US 2007/0008062 A1    Jan. 11, 2007

(51) Int. Cl.
*H01C 17/00* (2006.01)
(52) U.S. Cl. .................. 29/610.1; 29/620; 29/825; 29/846; 257/363; 257/516; 438/382; 438/384
(58) Field of Classification Search ............... 29/610.1, 29/620, 621, 825, 846, 847; 257/363, 516, 257/E21.006; 338/9, 25, 309; 438/382, 384
See application file for complete search history.

(56) References Cited

U.S. PATENT DOCUMENTS

| | | | | |
|---|---|---|---|---|
| 3,649,945 A | * | 3/1972 | Waits | 338/309 |
| 6,081,014 A | * | 6/2000 | Redford et al. | 257/359 |
| 6,171,922 B1 | * | 1/2001 | Maghsoudnia | 438/385 |
| 6,272,736 B1 | * | 8/2001 | Lee | 29/620 |

* cited by examiner

*Primary Examiner*—Thiem Phan
(74) *Attorney, Agent, or Firm*—Warren L. Franz; Wade J. Brady, III; Frederick J. Telecky, Jr.

(57) ABSTRACT

A method is provided of fabricating a thin film resistor semiconductor structure. In one aspect of the invention, the method includes forming a dielectric layer over a semiconductor substrate, forming a thin film resistor on the dielectric layer, and annealing the thin film resistor at a substantially high temperature for a predetermined time period to set the thermal coefficient of resistance of the thin film resistor. A passivation layer is formed over the semiconductor structure.

9 Claims, 4 Drawing Sheets

METHOD FOR FABRICATING A THIN FILM RESISTOR SEMICONDUCTOR STRUCTURE

TECHNICAL FIELD

The present invention relates generally to semiconductor devices and, more particularly, to fabricating a thin film resistor semiconductor structure.

BACKGROUND

In the semiconductor industry, there is a continuing trend toward higher device densities. To achieve these high densities, there has been and continues to be efforts toward scaling down device dimensions to submicron levels (e.g., below 0.35 microns) on semiconductor substrates. In order to accomplish such high device packing density, smaller and smaller features sizes are required. This may include the width and spacing of metal interconnecting lines, spacing and diameter of contact holes, and the surface geometry such as corners and edges of various features. Conventionally, analog precision and mixed signal devices have not been fabricated employing these submicron densities. This is because the precision of the analog devices and the selection of available materials for precision analog devices have been overriding factors over device density and device speed.

Conventionally, doped polysilicon is employed as a material of a resistor in a semiconductor fabrication. However, the resistance of a doped polysilicon resistor is controlled by the size of the predetermined length and area of the doped polysilicon layer. Therefore, to increase the resistance per unit of a resistor, thin film resistor materials are employed such as silicon chromium (SiCr) alloy, nickel chromium (NiCr) alloy, tantalum nitride, titanium nitride, and tungsten. Thin film resistors are very attractive components for high precision analog and mixed signal applications. In addition to a low thermal coefficient of resistance and low voltage coefficient of resistance, thin film resistors provide good resistor matching and good stability under stress. However, the thermal coefficient of resistance can shift during subsequent thermal processing of the thin film resistor.

SUMMARY

In one aspect of the present invention, a method is provided for fabricating a thin film resistor semiconductor structure. The method comprises forming a dielectric layer over a semiconductor substrate, forming a thin film resistor on the dielectric layer, and annealing the thin film resistor at a substantially high temperature for a predetermined time period to set the thermal coefficient of resistance of the thin film resistor. A passivation layer is formed over the semiconductor structure.

In another aspect of the present invention, another method is provided for fabricating a thin film resistor semiconductor structure. This method comprises forming a dielectric layer over a semiconductor substrate, forming a thin film resistor material layer on the dielectric layer, forming a barrier layer over the thin film resistor material layer, forming a capping layer over the barrier layer and etching away portions of the capping layer, the barrier layer and the thin film resistor material layer to form a thin film resistor structure. The method further comprises removing the capping layer, forming a contact material layer over the thin film resistor structure, and etching the contact material layer except at contact ends of the thin film resistor structure. The thin film resistor structure is annealed at a temperature of about 450° C. to about 550° C. for a predetermined time period to set the thermal coefficient of resistance of the thin film resistor within a range of about +/−5 ppm/° C., and a passivation layer is formed over the semiconductor structure.

In yet another aspect of the invention, yet another method is provided for fabricating a thin film resistor semiconductor structure. This method comprises forming a dielectric layer over a semiconductor substrate, forming an opening in the dielectric layer to a device in the semiconductor structure, forming a thin film resistor adjacent the opening on the dielectric layer, and forming a contact material layer over the thin film resistor structure and the dielectric layer, wherein the contact material layer couples the thin film resistor to the device in the semiconductor structure. The contact material layer is etched away except at contact ends of the thin film resistor. The thin film resistor is annealed at a temperature of about 450° C. to about 550° C. for about 15 minutes to about 25 minutes to set the thermal coefficient of resistance of the thin film resistor within a range of about +/−5 ppm, and a passivation layer is formed over the semiconductor structure.

DETAILED DESCRIPTION

The present invention relates generally to a method of fabricating a thin film resistor semiconductor structure. The method includes performing a temperature anneal at a substantially high temperature for a predetermined time period during the fabrication process to substantially stabilize the thermal coefficient of resistance of the thin film resistor. A substantially high temperature is defined herein as a temperature that is between about 400° C. to about 600° C. (e.g., about 500° C.). The time period for temperature anneal can range between about 10 minutes to about 60 minutes. The annealing process sets the temperature coefficient of resistance (TCR) of the thin film resistor to be within a range of about +/−5 ppm/° C. The TCR is a measure of the rate at which a resistor value varies with increasing or decreasing temperature and can be defined as follows:

$$TCR = ((R2-R1)/R1(T2-T1)) * 10^{-6} \qquad \text{EQ. 1}$$

where TCR is the temperature coefficient of resistance in ppm/° C., R1 is the resistance at low temperature T1 (e.g., 45° C.), R2 is the resistance at high temperature T2 (e.g., 145° C.). While the following description of the present invention is illustrated with respect to the structure shown in FIGS. 1-14, the present invention can be utilized in many semiconductor device structures.

Figure 1:
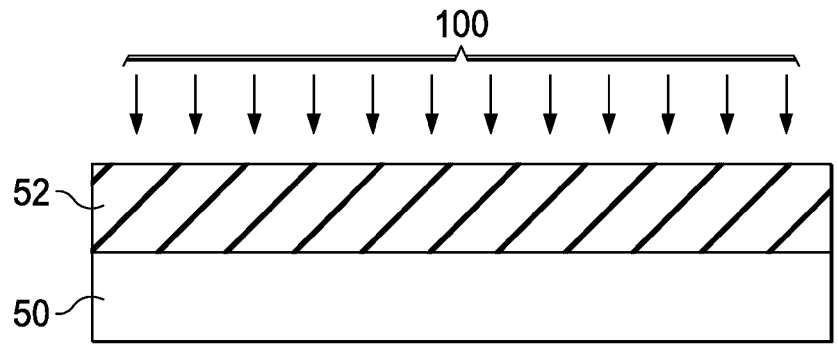
FIG. 1 illustrates a schematic cross-sectional view of a field oxide layer disposed over a semiconductor substrate semiconductor undergoing an etch step in accordance with an aspect of the present invention.

FIGS. 1-14 illustrate a methodology of fabricating a thin film resistor (TFR) semiconductor structure in accordance with an aspect of the present invention. FIG. 1 illustrates an oxide layer 52 disposed over a semiconductor substrate 50. The semiconductor substrate 50 can comprise any number of active devices including metal oxide semiconductors (MOS) transistors and/or bipolar transistors as well as any number of metal interconnect levels. The oxide layer 52 can comprise an oxide, such as silicon oxide formed using any suitable method including chemical vapor deposition Low Pressure Chemical Vapor Deposition (LPCVD), Plasma Enhanced Chemical Vapor Deposition (PECVD), High Density Plasma Chemical Vapor Deposition (HDPCVD), Physical Vapor Deposition (PVD), Metal Organic Chemical Vapor Deposition (MOCVD), Pulsed Laser Deposition (PLD), Atomic Layer Deposition (ALD), various sputtering techniques and other film growth techniques.

In one aspect of the present invention, the oxide layer 52 is formed using at least one of TEOS silicon oxides, PECVD silicon oxides, silicon nitrides, silicon oxynitrides, silicon carbides, spin-on glass (SOG) such as silsesquioxanes and siloxane, xerogels or any other suitable material. The field layer 52 can be planarized by a chemical mechanical polish (CMP).

A photoresist layer (not shown) is formed and patterned over the oxide layer 52. An etch 100 is performed on the oxide layer 52 underlying the photoresist layer to form a via or contact 56 (FIG. 2) in the oxide layer 52. The via or contact 56 is used to form an electrical connection between a thin film resistor and a device (e.g., transistor) residing in the underlying semiconductor substrate 50 (if 56 is a via) or another metal layer (if 56 is a contact). The etching of the oxide layer 52 can be performed using a dry etch process that is designed to stop on the semiconductor 50. For example, the field oxide layer 52 can be anisotropically etched with a plasma gas(es), such as carbon tetrafluoride ($CF_4$) containing fluorine ions, in a commercially available etcher, such as a parallel plate RIE apparatus or, alternatively, an electron cyclotron resonance (ECR) plasma reactor to thereby create the via 56. The resultant semiconductor structure is illustrated in FIG. 2 after the remaining patterned photoresist is stripped.

Figure 2:
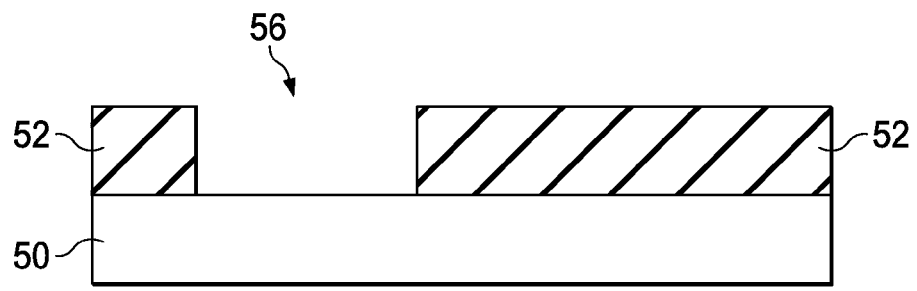
FIG. 2 illustrates a schematic cross-sectional view of a semiconductor structure of FIG. 1 after the etch step is substantially complete in accordance with an aspect of the present invention.
Figure 3:
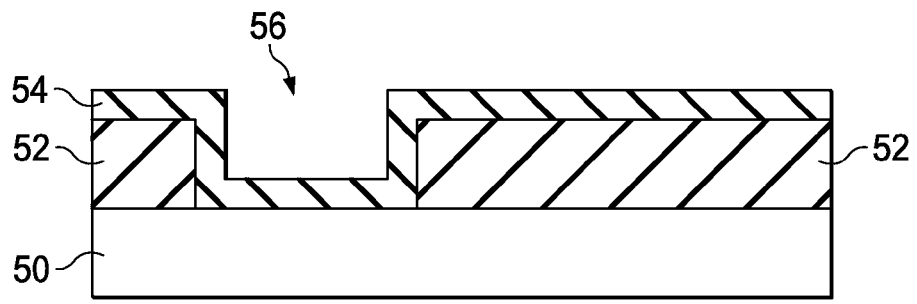
FIG. 3 illustrates a schematic cross-sectional view of the semiconductor structure of FIG. 2 after deposition of a mesa dielectric layer in accordance with an aspect of the present invention.
Figure 4:
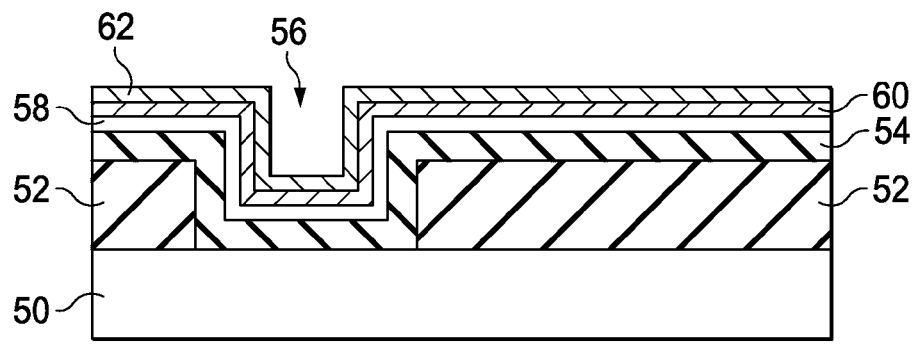
FIG. 4 illustrates a schematic cross-sectional view of the semiconductor structure of FIG. 3 after deposition of a thin film resistor material layer, a barrier layer and a capping layer in accordance with an aspect of the present invention.
Figure 5:
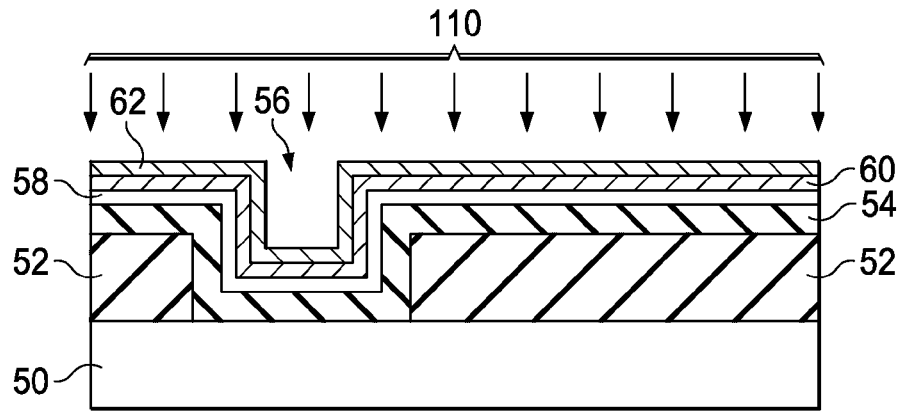
FIG. 5 illustrates a schematic cross-sectional view of the semiconductor structure of FIG. 4 undergoing an etch step in accordance with an aspect of the present invention.

FIG. 3 illustrates the semiconductor structure of FIG. 2 after deposition of a mesa dielectric layer 54. The mesa dielectric layer 54 can be formed of an oxide, a nitride or a layer of nitride disposed over a layer of oxide. FIG. 4 illustrates the structure of FIG. 3 after a number of material layers have been deposited over the mesa dielectric layer 54. The number of material layers includes a thin film resistor material layer 58, which can be formed using a silicon chromium (SiCr) alloy, nickel chromium (NiCr) alloy, tantalum nitride, titanium nitride, tungsten, or any other suitable resistor material. The thin film resistor material can be selected based on a particular implementation and a desired result. Any suitable technique for forming the thin film resistor material layer 58 can be employed such as Physical Vapor Deposition (PVD), Metal Organic Chemical Vapor Deposition (MOCVD), Pulsed Laser Deposition (PLD), Atomic Layer Deposition (ALD) and other film growth techniques. Alternatively, the thin film resistor material layer 58 can be formed, employing Low Pressure Chemical Vapor Deposition (LPCVD), Plasma Enhanced Chemical Vapor Deposition (PECVD), High Density Plasma Chemical Vapor Deposition (HDPCVD), or various sputtering techniques, to a thickness suitable for forming a TFR.

A barrier layer 60 is then deposited over the thin film material resistor layer 58. The barrier layer 60 can be formed from titanium tungsten (TiW) or titanium nitride (TiN). A capping layer 62 is then formed over the barrier layer 60. The capping layer 62 can be formed, for example, from an aluminum copper alloy (e.g., 99.5% aluminum, 0.5% copper).

Figure 6:
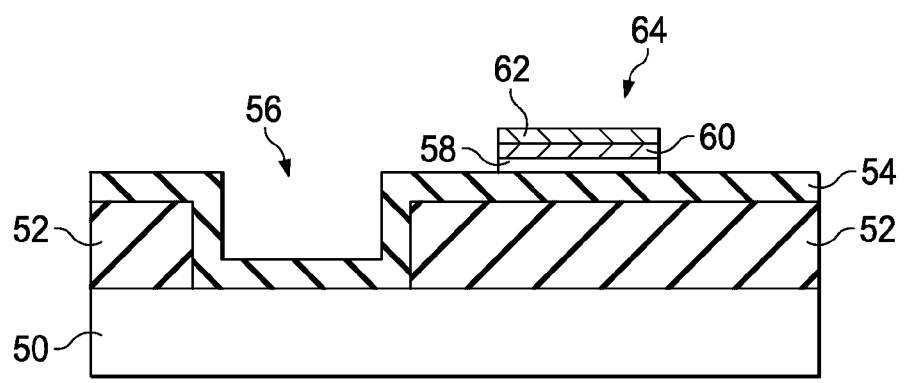
FIG. 6 illustrates a schematic cross-sectional view of the semiconductor structure of FIG. 5 after the etch step is substantially complete in accordance with an aspect of the present invention.

An etch 110 (FIG. 5) is performed on the thin film resistor material layer 58, the barrier layer 60 and the capping layer 62 to form a TFR structure 64 (FIG. 6). The TFR structure 64 is formed by etching the thin film resistor material layer 58, the barrier layer 60 and the capping layer 62 using a photoresist layer (not shown) as a masking layer. The thin film resistor material layer 58, the barrier layer 60 and the capping layer 62 can be etched using any suitable dry or wet etching process. A selective etch technique can be used to etch the material of the thin film resistor material layer 58, the barrier layer 60 and the capping layer 62 at a relatively greater rate as compared to the rate that the material of the patterned photoresist and the underlying mesa dielectric layer 54 is etched. The resultant structure is illustrated in FIG. 6 after the remaining patterned photoresist is stripped (e.g., ashing in an $O_2$ plasma).

Figure 7:
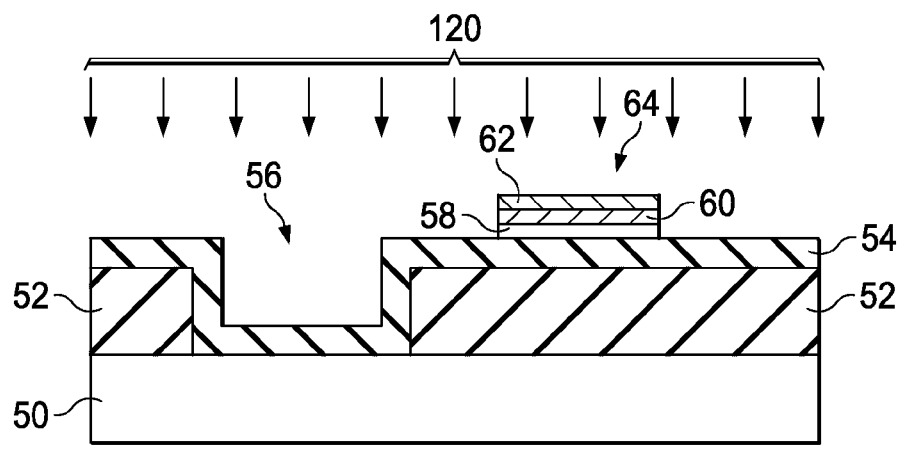
FIG. 7 illustrates a schematic cross-sectional view of the semiconductor structure of FIG. 6 undergoing an etch step to remove a capping layer in accordance with an aspect of the present invention.
Figure 8:
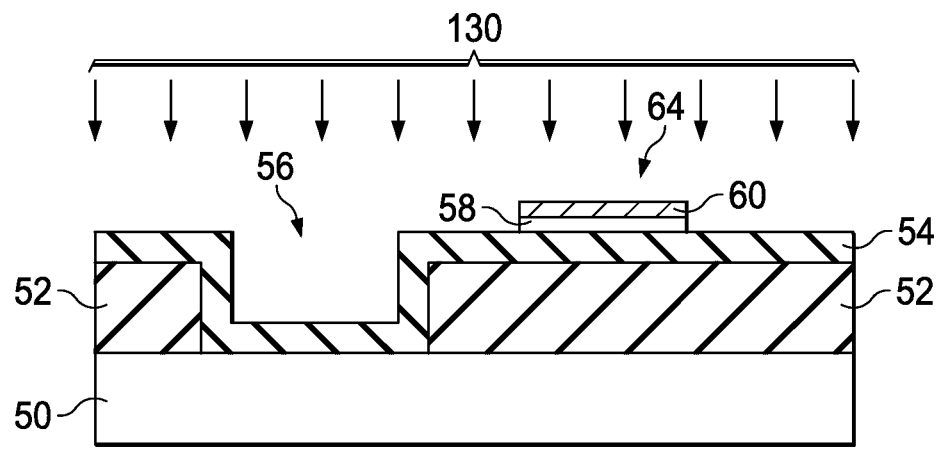
FIG. 8 illustrates a schematic cross-sectional view of the semiconductor structure of FIG. 7 undergoing an etch step to remove the mesa dielectric layer in accordance with an aspect of the present invention.
Figure 9:
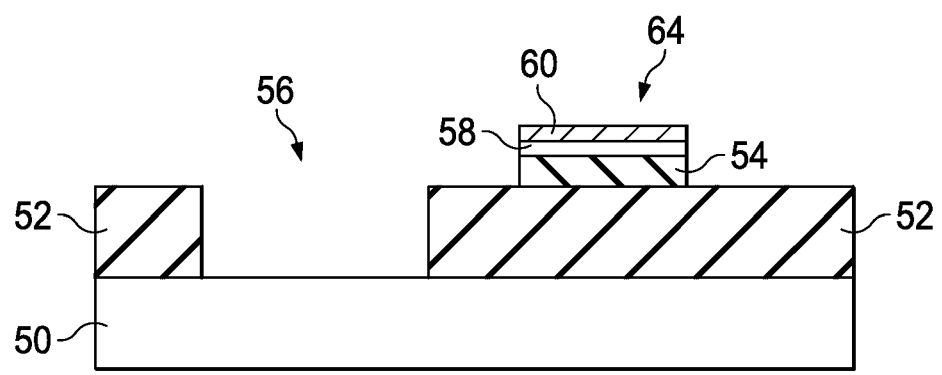
FIG. 9 illustrates a schematic cross-sectional view of the semiconductor structure of FIG. 8 after etching of the mesa dielectric layer is substantially complete in accordance with an aspect of the present invention.

Following the formation of the TFR structure 64, a subsequent etch 120 is performed, as illustrated in FIG. 7 to remove the capping layer 62 from the TFR structure 64. A mesa etch 130 is performed on the resultant structure as illustrated in FIG. 8 to remove the mesa dielectric layer 54 from the semiconductor structure. The resultant structure after the mesa etch 130 is performed is illustrated in FIG. 9 in which only a portion of the mesa dielectric layer 54 beneath the TFR structure 64 remains. Both the etch 120 and the etch 130 include forming a patterned photoresist layer, performing a selective etch and stripping the remaining patterned photoresist as described in the previous processing steps.

Figure 10:
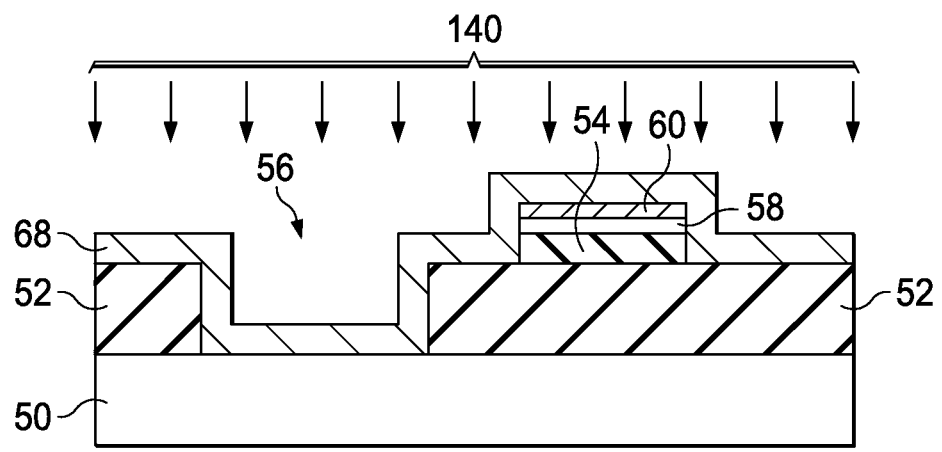
FIG. 10 illustrates a schematic cross-sectional view of the semiconductor structure of FIG. 9 undergoing a contact material layer etch after deposition of the contact material layer in accordance with an aspect of the present invention.

FIG. 10 illustrates performing an etch 140 on a contact material layer 68 formed over the structure of FIG. 9. The contact material layer 68 is employed to form electrical connections to a first contact end 70 and a second contact end 72 (FIG. 11) of the TFR structure 64. The contact material layer 68 can be formed from a conductive material, such as aluminum, aluminum alloy, copper, or a copper alloy. The contact material layer 64 electrically couples the first contact end 70 of the TFR structure 64 to the device in the semiconductor substrate underlying the via 56. The contact material layer 68 can be deposited by an appropriate deposition technique. In one aspect of the invention, a barrier layer (not shown) is deposited over the semiconductor structure prior to deposition of the contact material layer 68. This allows for increasing of a time period for a subsequent temperature annealing process, while still mitigating the likelihood of a junction spike of the contact material layer 68 into the semiconductor substrate 50.

Following the formation of the contact material layer 68, a patterned photoresist (not shown) is formed over the contact material layer 68, and is used as a pattern to remove a portion 66 of contact material layer 68 (FIG. 11) overlying a central portion of the TFR structure except at a first end and a second end of the TFR structure 64. A selective etch technique can be used to etch the contact material layer 68 at a relatively greater rate as compared to the rate that the material of the patterned photoresist is etched, and the underlying barrier layer 60 of the TFR structure 64. The barrier layer 60 protects the underlying thin film resistor layer 58 during the etch 140.

Figure 11:
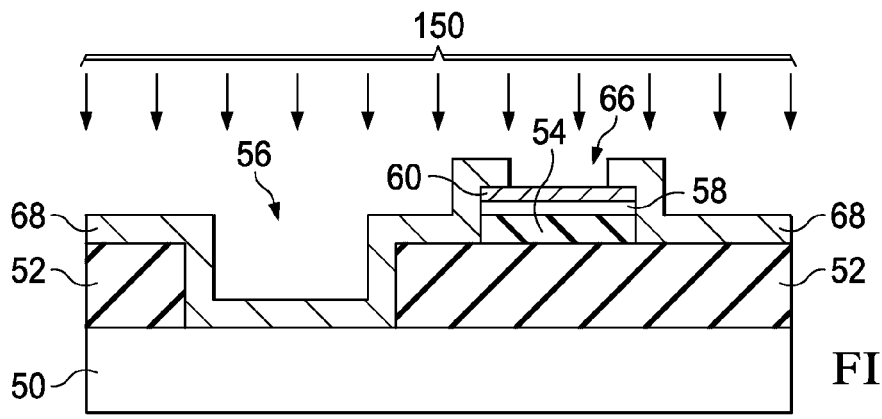
FIG. 11 illustrates a schematic cross-sectional view of the semiconductor structure of FIG. 10 undergoing an etch to remove a portion of a barrier layer overlying a central portion of the thin film resistor structure in accordance with an aspect of the present invention.
Figure 12:
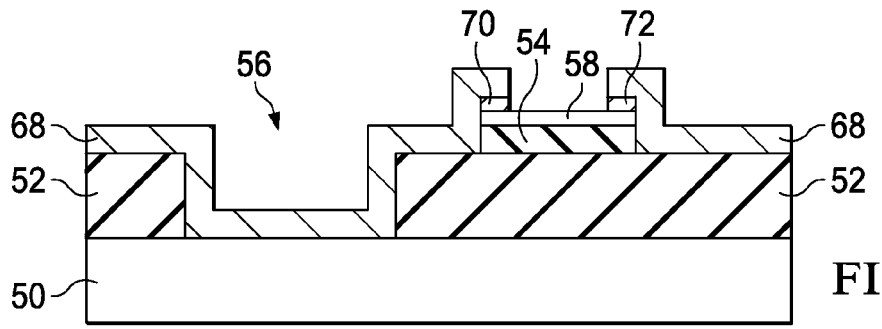
FIG. 12 illustrates a schematic cross-sectional view of the semiconductor structure of FIG. 11 after etching of the barrier layer is substantially complete in accordance with an aspect of the present invention.

Turning now to FIG. 11, the barrier layer 60 is shown undergoing an etching process 150 wherein the patterned contact material layer 68 serves as a hard mask. The etching process 150 can be a dry etch or a wet etch, that is highly selective to the barrier layer 60 with respect to the contact material layer 68 to remove a portion of the barrier layer 60 overlying the central portion of the thin film resistor layer 58. The resultant semiconductor structure is illustrated in FIG. 12.

Figure 13:
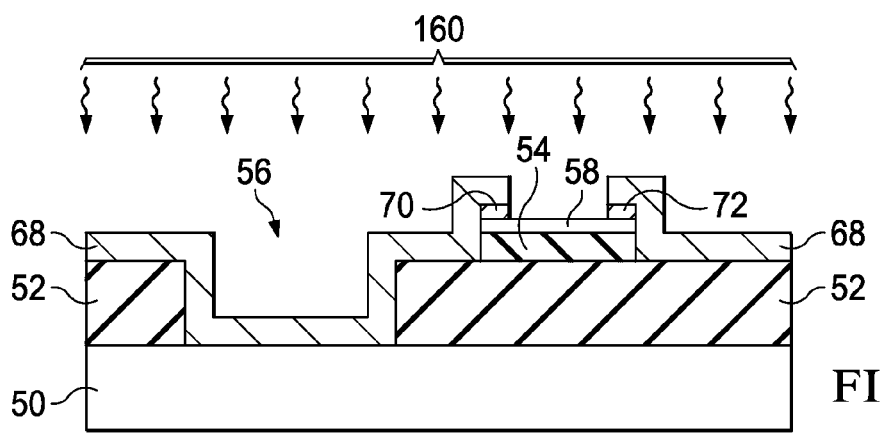
FIG. 13 illustrates a schematic cross-sectional view of the semiconductor structure of FIG. 12 undergoing a temperature annealing process in accordance with an aspect of the present invention.

FIG. 13 illustrates the semiconductor structure undergoing an annealing process 160. The annealing process 160 includes annealing the semiconductor structure in a fusion furnace at a temperature of about 400° C. to about 600° C. in a nitrogen ($N_2$) ambient for a predetermined time period of about 10 minutes to about 60 minutes. In one aspect of the invention, the annealing temperature is about 450° C. to about 550° C. in a nitrogen ($N_2$) ambient for a predetermined time period of about 15 minutes to about 25 minutes (e.g., 20 minutes). The annealing process sets the temperature coefficient of resistance (TCR) of the thin film resistor to be within a range of about +/−5 ppm/° C. If a barrier layer is provided between the contact material layer 68 and the semiconductor substrate 50, the predetermined time period can be extended to about 30 minutes to about 50 minutes (e.g., 40 minutes) for an annealing temperature of about 450° C. to about 550° C. in a nitrogen ($N_2$) ambient.

Figure 14:
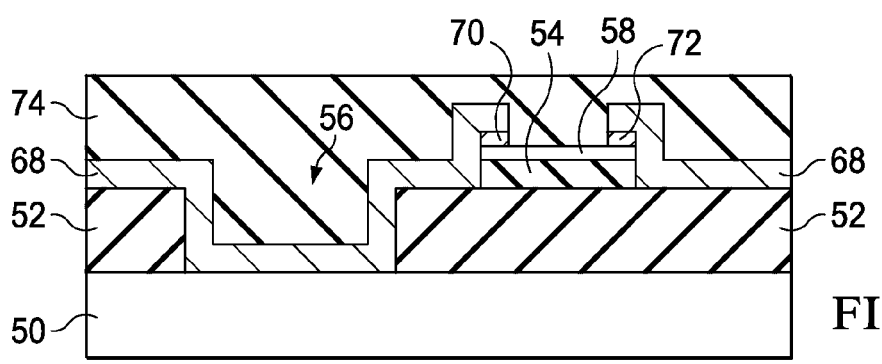
FIG. 14 illustrates a schematic cross-sectional view of the semiconductor structure of FIG. 13 after deposition of a passivation layer in accordance with an aspect of the present invention.

Following the annealing process, a passivation layer 74 is formed over the semiconductor structure as illustrated in FIG. 14. The passivation layer 74 can comprise an oxide layer, an oxynitride layer or layer of oxide and a layer of oxynitride. Bond pads can be opened to the semiconductor structure of FIG. 14 followed by final packaging, and testing. Testing can include laser trimming of the thin film resistor structure 64, probing of the wafer to determine the resistance value of the thin film resistor structure 64, and temperature cycling of the semiconductor structure.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A method for fabricating a thin film resistor semiconductor structure, the method comprising:
   forming a dielectric layer over a semiconductor substrate;
   forming an opening in the dielectric layer to the semiconductor substrate;
   forming a mesa dielectric layer over the dielectric layer and the opening in the dielectric layer;
   forming a thin film resistor material layer on the mesa dielectric layer;
   forming a capping layer over the mesa dielectric layer;
   etching portions of the capping layer and the thin film resistor material layer to form a thin film resistor structure;
   removing the capping layer;
   etching portions of the mesa dielectric layer to form an opening in the mesa dielectric layer at least at the opening in the dielectric layer, leaving portions of the mesa dielectric layer beneath the thin film resistor structure remaining;
   forming a contact material layer over the thin film resistor structure and the opening in the mesa dielectric layer;
   etching a portion of the contact material layer overlying a central portion of the thin film resistor structure except for contact ends of the thin film resistor; and
   annealing the thin film resistor structure at a temperature of about 400° C. to about 600° C. in an inert gas ambient for a time period of about 10 to about 60 minutes to set the thermal coefficient of resistance of the thin film resistor structure to be within a range of about +/−5 ppm/° C.

2. The method of claim 1, wherein the time period comprises about 15 minutes to about 25 minutes.

3. The method of claim 1, further comprising forming a barrier layer over the thin film resistor material layer; wherein forming the capping layer comprises forming the capping layer over the barrier layer; and wherein etching portions of the capping layer and the thin film resistor material layer to form the thin film resistor structure comprises etching portions of the capping layer, the barrier layer and the thin film resistor material layer to form the thin film resistor structure.

4. The method of claim 3, wherein the time period comprises about 30 minutes to about 50 minutes.

5. The method of claim 3, wherein etching the portion of the contact material layer includes etching a portion of the baffler layer overlying the central portion of the thin film resistor structure except for the contact ends.

6. The method of claim 1, wherein the opening in the dielectric layer is an opening to a device in the semiconductor substrate; and wherein the contact material layer couples a first end of the thin film resistor structure through the opening in the mesa dielectric layer and the opening in the dielectric layer to the device in the semiconductor substrate.

7. The method of claim 1, wherein the thin film resistor material layer is formed from one of silicon chromium (SiCr) alloy, nickel chromium (NiCr) alloy, tantalum nitride, titanium nitride, and tungsten.

8. A method for fabricating a thin film resistor semiconductor structure, the method comprising:
forming a dielectric layer over a semiconductor substrate;
forming a thin film resistor material layer over the mesa dielectric layer;
forming a baffler layer over the thin film resistor material layer;
forming a capping layer over the baffler layer;
etching portions of the capping layer, the barrier layer and the thin film resistor material layer to form a thin film resistor structure;
removing the capping layer;
forming a contact material layer over the thin film resistor structure;
etching a portion of the contact material layer overlying a central portion of the thin film resistor structure except for contact ends of the thin film resistor;
annealing the thin film resistor structure at a temperature of about 500° C. in a nitrogen ($N_2$) ambient for a time period of about 10 to about 60 minutes to set the thermal coefficient of resistance of the thin film resistor structure to be within a range of about +/−5 ppm/° C.; and
forming a passivation layer over the semiconductor structure; further comprising:
forming an opening in the dielectric layer to the semiconductor substrate;
forming a mesa dielectric layer over the dielectric layer and the opening in the dielectric layer prior to forming the thin film resistor material layer; and
forming an opening in the mesa dielectric layer by etching portions of the mesa dielectric layer such that only portions of the mesa dielectric layer beneath the thin film resistor material remain prior to forming the contact material layer over the thin film resistor structure.

9. A method for fabricating a thin film resistor semiconductor structure, the method comprising:
forming a dielectric layer over a semiconductor substrate;
forming a contact opening in the dielectric layer to a device in the semiconductor substrate;
forming a mesa dielectric layer over the dielectric layer and the opening in the dielectric layer;
forming a thin film resistor material layer on the mesa dielectric layer;
forming a baffler layer over the thin film resistor material layer;
forming a capping layer over the baffler layer;
etching portions of the capping layer, the barrier layer and the thin film resistor material layer to form a thin film resistor structure;
removing the capping layer;
etching portions of the mesa dielectric layer to remove portions of the mesa dielectric layer from over the dielectric layer and the opening in the dielectric layer, leaving portions of the mesa dielectric layer beneath the thin film resistor structure remaining;
forming a contact material layer over the thin film resistor structure and the opening in the dielectric layer;
etching a portion of the contact material layer and a remaining portion of the previously etched barrier layer overlying a central portion of the thin film resistor structure except for contact ends of the thin film resistor structure; wherein the etched contact material layer couples a first end of the thin film resistor structure through the opening in the dielectric layer to the device in the semiconductor substrate;
annealing the thin film resistor structure at a temperature of about 400° C. to about 600° C. in a nitrogen ($N_2$) ambient for a time period of about 10 to about 60 minutes to set the thermal coefficient of resistance of the thin film resistor structure to be within a range of about +/−5 ppm/°C.; and
forming a passivation layer over the semiconductor structure.

* * * * *